US011322366B1

(12) United States Patent
Currie et al.

(10) Patent No.: US 11,322,366 B1
(45) Date of Patent: May 3, 2022

(54) ULTRAFAST LASER ANNEALING OF THIN FILMS

(71) Applicant: The Government of the United States of America, as represented by the Secretary of the Navy, Arlington, VA (US)

(72) Inventors: Marc Currie, Washington, DC (US); Virginia D. Wheeler, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/158,120

(22) Filed: Jan. 26, 2021

(51) Int. Cl.
  *H01L 21/00* (2006.01)
  *H01L 21/477* (2006.01)
(52) U.S. Cl.
  CPC .................................. *H01L 21/477* (2013.01)
(58) Field of Classification Search
  None
  See application file for complete search history.

(56) References Cited

U.S. PATENT DOCUMENTS

2009/0221141 A1* 9/2009 Cheng ................ H01J 9/02
                                                                 438/609

FOREIGN PATENT DOCUMENTS

CN      206422052 U   *   8/2017

OTHER PUBLICATIONS

Wang et al., "Switchable wavelength-selective and diffuse metamaterial absorber/emitter with a phase transition spacer layer", Applied Physics Letters, 105, 071907 (2014). (Year: 2014).*
M. Currie, et al., "Atomic Layer Deposition of Vanadium Dioxide and a Temperature dependent Optical Model," JoVE (Journal of Visualized Experiments), No. 135, p. e57103, May 2018.
J. Jiang, et al., "Ultrafast Self Assembly of Sub 10 nm Block Copolymer Nanostructures by Solvent Free High Temperature Laser Annealing," ACS Appl. Mater. Interfaces, vol. 9, No. 37, p. 31317 31324, Sep. 2017.
A. Colin et al., "Simulation of the sub melt laser anneal process in 45 CMOS technology—Application to the thermal pattern effects," Materials Science and Engineering: B, vol. 154-155, p. 31 34, Dec. 2008.

* cited by examiner

*Primary Examiner* — Reema Patel
(74) *Attorney, Agent, or Firm* — US Naval Research Laboratory; Joslyn Barritt

(57) ABSTRACT

A method for locally annealing and crystallizing a thin film by directing ultrashort optical pulses from an ultrafast laser into the film. The ultrashort pulses can selectively produce an annealed pattern and/or activate dopants on the surface or within the film.

9 Claims, 6 Drawing Sheets

Competition between
$VO_2$ and $V_2O_5$ $VO_2$ melting

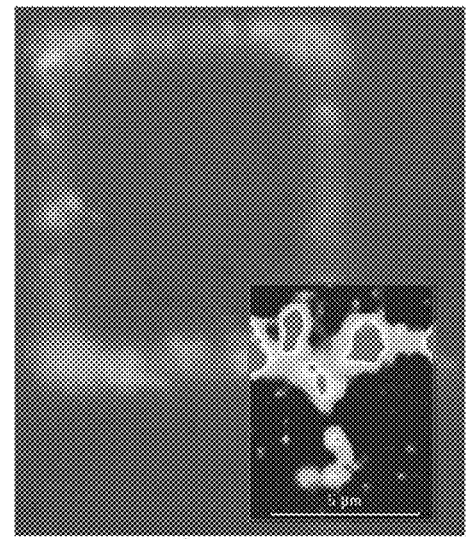
FIG. 7A  FIG. 7B
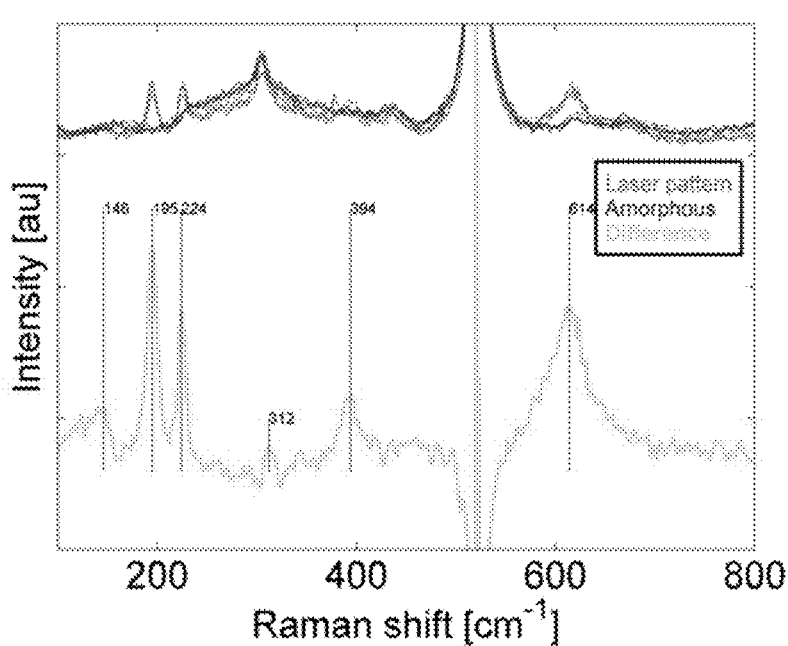
FIG. 7C

ULTRAFAST LASER ANNEALING OF THIN FILMS

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #113380.

TECHNICAL FIELD

The present disclosure relates to ultrafast annealing of thin films using sub-picosecond optical pulses from an ultrafast laser.

BACKGROUND

Crystalline materials and their non-crystalline solid (amorphous) forms can have large variations in their physical properties. Crystallization of amorphous materials is usually thermally activated, e.g., via annealing, where a critical temperature is required to allow deformation thereby producing nucleation and growth of crystal grains. Over time, this applied thermal energy enables these grains to produce a crystalline, ordered material from the amorphous, disordered material.

Existing methods known in the art for annealing thin films include conventional thermal annealing, in which the entire sample is heated to high temperatures in a controlled environment for up to several hours; rapid thermal annealing, in which the entire sample is heated to high temperatures for a few minutes at a time; spike annealing, in which the temperature is rapidly ramped up (e.g., at a rate of about 100° C./second), remains at the high temperature for about a second, and then is ramped down; and laser spike annealing, where a thin film sample on a substrate is heated in a local area by a laser beam for a few milliseconds to a few seconds, during which either the substrate absorbs the laser energy or additional absorption layers are employed to increase temperature uniformity across the sample.

However, these annealing techniques are often slow and can expose the entire sample stack to the high annealing temperatures, even if only a portion of the sample needs to be annealed. In addition, thermal annealing for long time periods can have undesirable effects in the annealed sample, such as material diffusion, thermal decomposition, thermal oxidation, surface bonding issues, film delamination, and different reaction rates of the constituent elements, all of which can have a deleterious impact on the annealed material.

One thin film material whose annealing has been recently analyzed is amorphous vanadium oxide ($VO_2$) grown by atomic layer deposition (ALD) to produce a thin film on a substrate. The annealing parameters used for this material are critical if production of phase pure $VO_2$ thin films with large-area uniformity is to be achieved. For example, optimized oxygen pressure, anneal temperature, and anneal time are all necessary to produce high quality $VO_2$ films. See M. Currie, et al., "Atomic Layer Deposition of Vanadium Dioxide and a Temperature-dependent Optical Model," *JoVE* (*Journal of Visualized Experiments*), no. 135, p. e57103, May 2018.

Vanadium dioxide ($VO_2$) is a phase-change material with remarkable properties. Its reversible phase transition near room temperature allows it to exist either in a metallic or insulating state. Thus, temperature-induced phase changes can produce upwards of six orders-of-magnitude changes in electrical resistance as well as large changes in infrared emissivity and optical refractive index. However, this phase transition and concomitant variation in properties only exists in stoichiometric, crystalline $VO_2$ and is essentially non-existent in amorphous $VO_2$. Annealing amorphous $VO_2$ is a method for producing high-quality crystalline $VO_2$.

FIGS. 1A-1D illustrate aspects of $VO_2$ thin films that have been annealed using conventional rapid thermal annealing in accordance with the prior art. The optical microscopy images in FIGS. 1A and 1B, respectively, show 10 nm-thick and 20 nm-thick $VO_2$ films that have been annealed using this conventional technique at 500° C. for 0.5 hour at $O_2$ pressures in the mTorr range, and show the deleterious effects that such annealing can have. As can be seen from these images, the films delaminate during the anneal due to stress between the crystallizing film and the underlying substrate, resulting in a film that is transformed from a uniform $VO_2$ film into a film having clusters of $V_2O_5$ wires as shown in FIG. 1A or a plurality of single $V_2O_5$ wires having little film there between as shown in FIG. 1B. The Raman spectroscopy in FIG. 1C confirms the presence of $V_2O_5$, both in the cluster of wires such as is shown in FIGS. 1A and 1$n$ single wires such as are shown in FIG. 1B. Similarly, X-ray diffraction analysis shown in FIG. 1D confirms the conversion $VO_2$ thin film to $V_2O_5$ after rapid thermal annealing, suggesting that such an annealing technique alters stoichiometry of the material so substantially that it crystallizes in multiple phases and is no longer useful as a phase change material.

The most critical aspect in conventional thermal annealing of $VO_2$ is the partial pressure of oxygen. The atomic-force microscopy (AFM) images in FIGS. 2A-2C illustrate the effects of $O_2$ pressure on an annealed $VO_2$ thin film. The film shown in FIG. 2A, annealed at a low $O_2$ pressure of 1 E-5 Torr, exhibits low surface roughness and crystalizes into a high-quality uniform $VO_2$ film. However, as shown in FIGS. 2B and 2C, higher $O_2$ pressures can lead to undesirable faceting, grain growth, and nanowire formation as well as the formation of other $VO_2$ phases, while low pressures in the absence of oxygen also result in crystallizing other $VO_2$ phases.

The annealing temperature is also critical to maintain the stoichiometry of the film and minimize film roughness, with too high a temperature causing a loss of stoichiometry and producing facets and pinholes in the film.

Other factors also affect the annealing process. For example, there is a trade-off between temperature and annealing time, with higher temperatures allowing a shorter annealing time. Film thickness is another anneal parameter, since thicker films can require longer crystallization times. The thermal heating and cooling rates during anneal also impact the film roughness and morphology.

In another existing technique, the sample is heated with a laser. In this technique, a laser is used to illuminate a small area, e.g., approximately 1 mm² laterally, on the sample surface for a duration on the order of milliseconds. The heated area is larger than the laser-illuminated area due to thermal diffusion. In this case, the laser energy is often absorbed by the substrate for efficient heating via linear optical absorption. See J. Jiang, et al., "Ultrafast Self-Assembly of Sub-10 nm Block Copolymer Nanostructures by Solvent-Free High-Temperature Laser Annealing," *ACS*

*Appl. Mater. Interfaces*, vol. 9, no. 37, pp. 31317-31324, September 2017. Additional absorption layers can be added to enable more uniform laser heating at the expense of a more complex layered material with modified electrical, optical, thermal, and mechanical material performance due to this absorption layer. See A. Colin et al., "Simulation of the sub-melt laser anneal process in 45 CMOS technology—Application to the thermal pattern effects," *Materials Science and Engineering: B*, vol. 154-155, pp. 31-34, December 2008.

However, the use of continuous wave, long laser pulses, or substrate absorption in existing laser annealing technologies have produced issues like explosive crystallization, uncontrolled dendrite- and wire-like formations, changes in oxygen content, changes in stoichiometry, as well as delamination of the thin films from the substrates. Also, the relatively large-area thermal heating in current laser annealing techniques can cause dopant activation and/or diffusion at and near the laser anneal process.

FIGS. 3A and 3B illustrate aspects of conventional long-pulse laser annealing of $VO_2$ films in accordance with the prior art. The optical microscopy image in FIG. 3A shows an amorphous $VO_2$ film that has been laser annealed by a 0.25-ms pulse from a 20 W CO2 laser in air. As can be seen from the image in FIG. 3A, the film contains dissociated areas comprising "propeller"-shaped $VO_2$ features within a $V_2O_5$ bulk. This is confirmed by Raman spectroscopy of the film, as shown in FIG. 3B, where the areas of the film comprising the propeller-shaped features exhibit peaks associated with $VO_2$ while the remainder of the film exhibits peaks associated with $V_2O_5$. FIGS. 3C and 3D further illustrate these effects. As noted above, conventional laser annealing of $VO_2$ films can result in a dissociated film comprising small $V_2O_5$ "propellers" being formed within a $VO_2$ bulk, as seen in FIG. 3C. Attempts to reintegrate the material by further heating are not successful, but instead, as illustrated in FIG. 3D, merely result in the melting of the propellers within the $V_2O_5$ material so that only vanadium droplets remain on the surface of the substrate, with no film remaining.

All of these constraints limit the implementation of traditional annealing for amorphous materials on soft substrates, in large areas where maintaining an optimal annealing environment (oxygen, argon, vacuum, etc.) is difficult and/or expensive, and/or where localized annealing only within the amorphous material is desired.

Thus, parameters for standard annealing of materials such as amorphous $VO_2$ into a crystalline film need to be carefully chosen or else the resulting film will not be the high-quality crystalline films that are desired.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a method for using an ultrafast laser which emits sub-picosecond optical pulses to locally anneal and crystallize thin films at ultrafast time scales, i.e., at time scales of less than 10 nanoseconds. Since this laser technique can perform localized annealing and crystallization, this method enables patterning of thin films with the ability to achieve sub-micrometer resolution. In addition, this method also enables annealing thin films on substrates that cannot handle traditional growth and annealing temperatures. Finally, this ultrafast annealing technique can be conducted in atmosphere without chambers or environmental gas control, which is required for many thermal annealing processes.

A sub-picosecond laser pulse is applied to the surface of the thin film to be annealed. The ultrafast laser pulses are absorbed into the electronic system of the sample through a process of linear and nonlinear multiphoton processes. The annealing process resulting from nonlinear interactions between the laser and sample causes the annealed area to be smaller than the laser beam area, and is concentrated near the peak of the spatial distribution of the optical pulse, which is often Gaussian shaped.

The use of an ultrafast sub-picosecond pulsed laser in accordance with the present invention produces a smaller heat-affected zone. As a result, by focusing the laser on a specific location on the film surface, sub-micron-scale annealed features can be produced. For thicker films, nonlinear optical absorption is highly dependent on the optical intensity, so that focusing the laser below the surface enables large laser absorption in sub-micron volumes below the surface of the material, enabling the formation of 3D patterned crystalline material within a bulk object.

BRIEF DESCRIPTION OF THE DRAWINGS

FIGS. 7A-7C further illustrate aspects of patterning of $VO_2$ thin films using ultrafast annealing in accordance with the present invention.

DETAILED DESCRIPTION

Figure 1A:
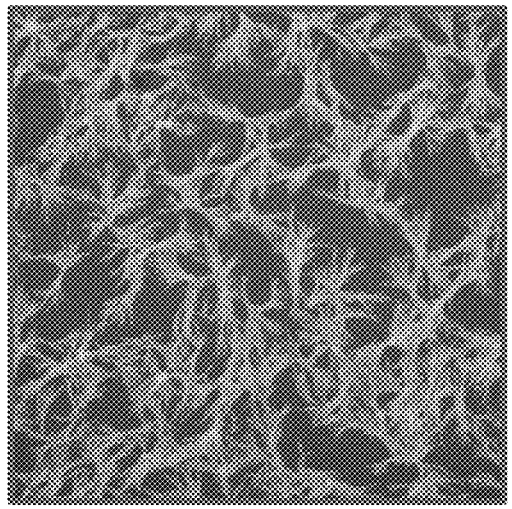
FIGS. 1A-1D illustrate aspects of thermal annealing of $VO_2$ films in accordance with the prior art.
Figure 1B:
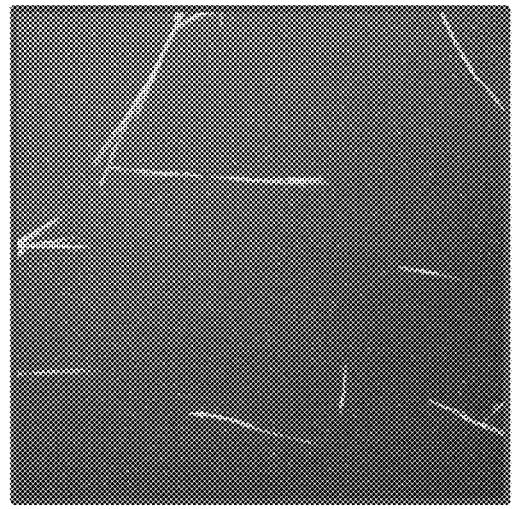
Figure 1C:
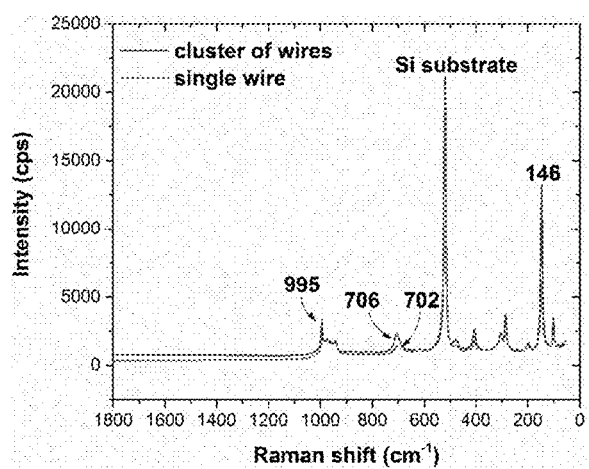
Figure 1D:
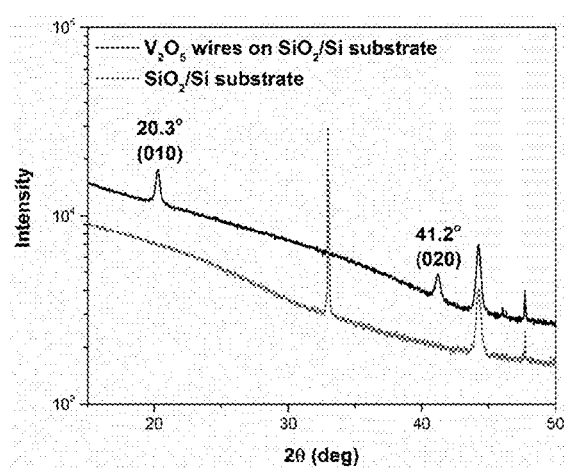
Figures 2A, 2B, 2C:
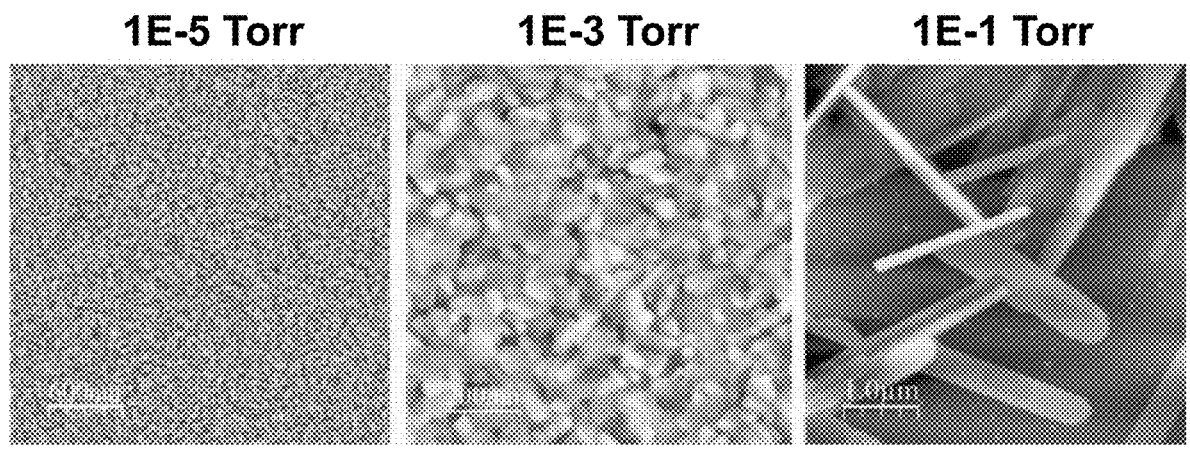
FIGS. 2A-2C are atomic force microscopic (AFM) images showing the results obtained for thermal annealing $VO_2$ at different $O_2$ partial pressures.
Figure 3A:
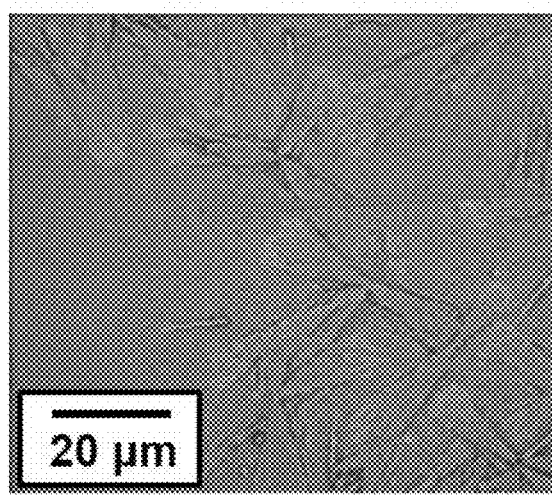
FIGS. 3A, 3C, and 3D are images illustrating the results of millisecond-pulse laser annealing of amorphous $VO_2$ films in accordance with the prior art.
Figure 3B:
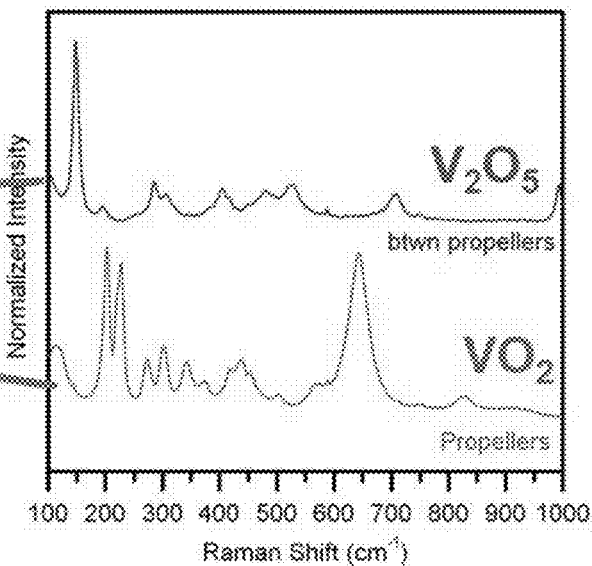
FIG. 3B is Raman spectroscopy of regions in FIG. 3A showing crystalline regions of $VO_2$ or $V_2O_5$ produced in this annealing process.
Figure 3C:
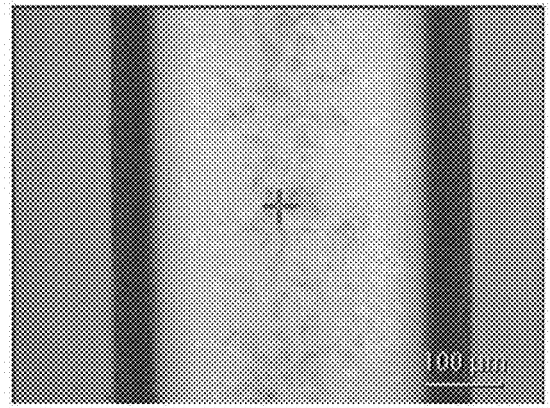
Figure 3D:
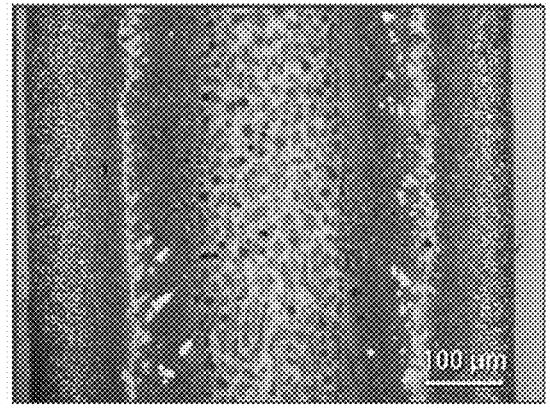

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a method for using an ultrafast laser that emits sub-picosecond optical pulses to locally anneal and crystallize thin films within nanoseconds or faster. Since this laser technique performs localized annealing and crystallization, this method enables patterning of thin films with the ability to achieve sub-micrometer resolution. In addition, this method also enables annealing thin films on substrates that cannot handle traditional growth and annealing temperatures. Finally, this ultrafast annealing technique can be conducted in atmosphere without chambers or ambient gas control, which is required many thermal annealing processes.

Unlike other laser annealing techniques which use Excimer and ultraviolet lasers, the method of the present invention can use near-infrared lasers, which can avoid absorption of the laser energy in the substrate material, and thereby enable efficient transfer of laser energy to the thin film to be crystallized. In addition, instead of the longer pulse durations used by Excimer and other lasers, the sub-picosecond pulses used in the method of the present invention produce rapid energy excitation of the sample.

In the present disclosure, annealing in accordance with the present invention is described in the exemplary context of annealing an amorphous $VO_2$ film so as to produce a crystalline $VO_2$ thin film. However, one skilled in the art will readily recognize that the annealing principles and techniques described herein can be applied to annealing of other amorphous and non-amorphous materials within the scope and spirit of the present disclosure.

In accordance with the present invention, a series of sub-picosecond laser pulses are applied to the surface of the thin film to be annealed.

Typical laser parameters depend on optical and thermal properties of the materials and substrates used.

For example, to avoid linear absorption in a silicon substrate a user ideally would want to use an excitation energy less than the bandgap energy of silicon (~1.1 eV, or 1100-nm wavelength).

In addition, ideally the user would choose an excitation energy where the cross-section for multi-photon absorption was greater in the film material than in the substrate.

Along with the materials' absorption cross section, the incident laser pulse fluence will also impact how much energy is deposited in the materials, and this energy must not exceed material damage thresholds.

Parameters such as the laser's pulse repetition rate will depend on the deposited energy density as well as the thermal properties of the film and substrate. A pulse repetition rate that is too high may produce a local temperature increase which does not decay between pulses, and make this annealing process similar to that of the current long-pulse annealing techniques. However, in some instances, depending on the material, a nominal rise in the local temperature may also be a catalyst for ultrafast annealing through modification of materials' physical properties.

The ultrafast sub-picosecond laser pulses are absorbed into the electronic system of the sample through a process of linear and nonlinear multiphoton processes which take place in less than a picosecond. This is unlike other laser annealing processes which use longer (mostly ns- and ms-time-scale) laser pulses and interact with the samples via linear absorption. In addition, other laser annealing techniques use multiple laser beams and also target absorption by the substrate as an indirect thermal heating mechanism. In contrast, use of sub-picosecond laser pulses in accordance with the present invention enables rapid athermal and thermal processes to occur and further enables nonequilibrium interactions between the laser pulse and the sample to crystallize and anneal the amorphous material.

The annealing process resulting from nonlinear absorption interactions can cause the annealed area to be smaller than the laser beam area. For example, an optical pulse with a Gaussian spatial profile will have the nonlinear absorption concentrated near the peak of the spatial distribution, and thereby reduce the absorption area compared with the area of the optical pulse.

Due to its combination of athermal and thermal responses, the sub-picosecond laser pulse used in the annealing process in accordance with the present invention also produces a smaller heat-affected zone, and therefore the interaction (heating/annealing) with surrounding regions is dramatically reduced. As a result, by focusing the laser on a specific location on the film surface, sub-micron-scale annealed features can be produced.

For thicker films, nonlinear optical absorption is highly dependent on the optical intensity, so that focusing the laser below the surface enables large laser absorption in sub-micron volumes below the surface of the material, enabling the formation of "channels" of crystalline material within a bulk object. Laser pulse parameters for achieving this depend on the linear and nonlinear optical properties of the thicker film materials, such that there is minimal linear absorption thereby locally restricting the absorption to the neighborhood of the focused laser.

These ultrafast laser pulses interact with the sample and deposit their energy at sub-picosecond time scales. This enables nonequilibrium electronic states which produce "hot" carriers that have a larger kinetic energy than they would in equilibrium. These hot carriers can be rapidly ionized, and their rapid ionization produces energetic interactions with atoms and their bonds, which at higher laser excitation intensity can rapidly produce spatially-complex highly-ionized regions that lead to Coulombic explosions. Even for energies far below that needed for Coulombic explosion, the rapidly-ionized nonequilibrium electronic states can modify surface states with enough energy to break bonds with adsorbed species, enable dielectric screening, or polarize the material all within picoseconds, and long before thermal processes begin.

The ultrafast laser pulses used in the annealing process in accordance with the present invention have a high spatio-temporal photon density, which can create strong nonlinear photon effects. In an exemplary case, a continuous wave (cw) laser having an average power of 1 mW and a spot size of 1 μm will generate approximately 200 photons per each 50 fs period. The same 1-mW average power from a pulsed laser emitting 4 nJ pulses having a pulse duration of 50 fs at a 250 kHz repetition rate will generate approximately $2^{10}$ photons for each 50 fs period. As these photons are absorbed by the thin film, a large nonequilibrium distribution of carriers forms in the thin film. Because large numbers of these carriers thermalize via electron-electron scattering before they relax, the laser pulse produces billions of energized electrons having electron kinetic energies of 0.2-2 eV and electron temperatures of 1,000 to 24,000K, while the lattice remains at near ambient temperature during the duration of the 50 fs pulse, as illustrated by the block schematic shown in FIG. 4.

Figure 4:
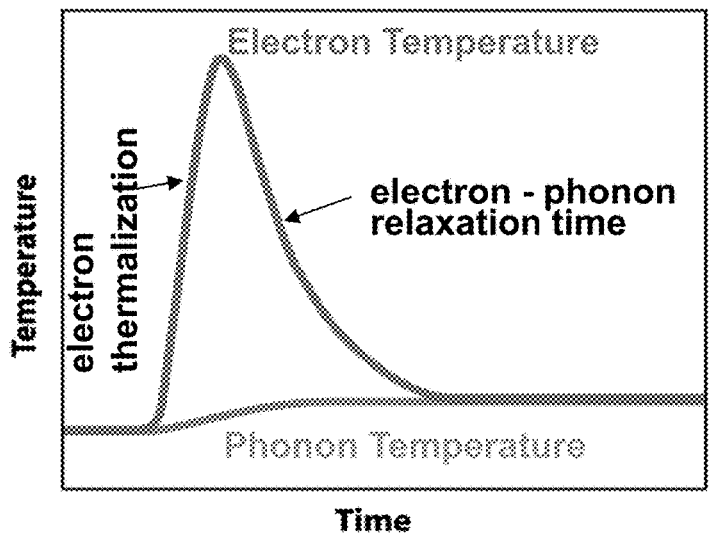
FIG. 4 is a block schematic illustrating the time evolution of "hot" electron thermalization produced by a sub-picosecond laser pulse used to achieve ultrafast laser annealing of a thin film in accordance with the present invention.

These energetic hot carriers transfer their energy to the phonons/lattice, as shown in FIG. 4, where the time scale (x-axis in FIG. 4) is material dependent, but for many materials is much less than one nanosecond. This energy provides the mechanism to anneal the thin film on this sub-nanosecond time scale. This excitation and relaxation of the thin film occurs in a matter of 10s of picoseconds, with the electrons and phonons coming into local equilibrium at a temperature a little above ambient in much less than a nanosecond.

Figure 5:
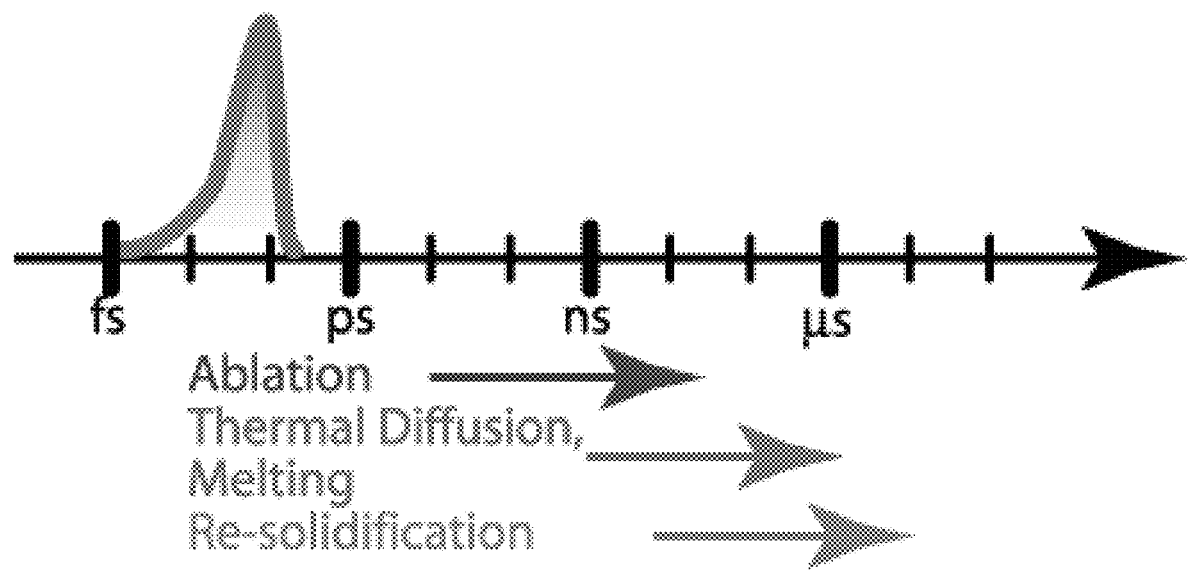
FIG. 5 is a block schematic illustrating the time scale of ultrafast laser annealing of a thin film in accordance with the present invention versus other processes.

As illustrated by the block schematic in FIG. 5, all of this occurs in much less time than that needed for ablation, thermal diffusion and melting, and/or re-solidification of the film to occur. In many cases, ablation takes place at a ns time scale, thermal diffusion and melting takes place at a µs time scale, and re-solidification takes place at a >µs time scale. However, in other cases, one or more of these processes in accordance with the present invention can occur on other time scales, e.g., some ablation can occur in 10+ ps, while thermal diffusion, melting and resolidification can occur on time scales as short as 1-10 ns.

For some materials, like $VO_2$, thermal annealing often requires a procedure to ensure that its constituent elements or other materials do not diffuse into or out of the film, which would leave non-stoichiometric films and inhibit the formation of a film with the required phase. Since diffusion lengths are proportional to the square root of the diffusion time, an ultrafast optical pulse of a sub-picosecond time scale produces sub-nanometer diffusion lengths, thereby ensuring elements would not diffuse through the thin films. One advantage of this method is that these ultrafast laser processes enable annealing to be conducted in atmosphere without chambers or environmental gas control.

Due to its potential for annealing sub-micron regions without influencing the surrounding regions, this ultrafast laser annealing technique can be applied to laser patterning a portion of the sample, rather than, for example, annealing the entire sample and then removing the unwanted material.

Figure 6:
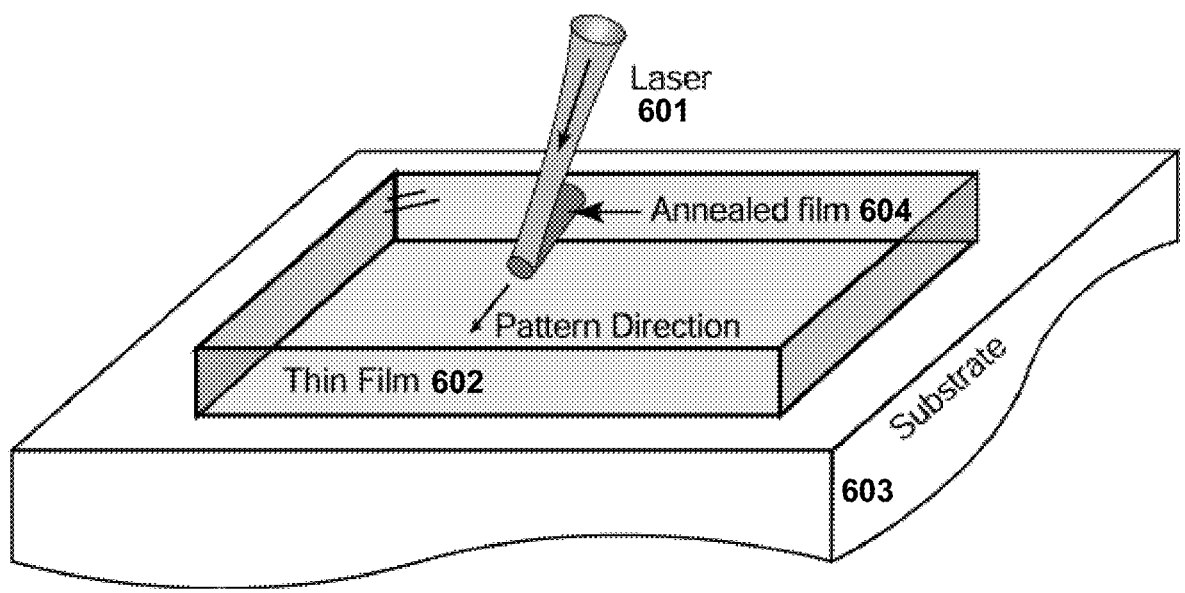
FIG. 6 is a block schematic illustrating how the ultrafast laser annealing of a thin film, in accordance with the present invention, can be used to pattern the surface of the film.

Thus, as illustrated by the block schematic in FIG. 6, a sub-picosecond pulsed laser 601 can be directed onto a thin film 602 on a substrate 603, with an annealed area 604 of crystalline material being formed as a result of the thermal and athermal processes described above. As the laser is moved relative to the surface of the film, either by moving the laser or by moving the substrate/film sample, the film can be selectively annealed and a desired pattern of crystalline areas of the film can be produced. This laser-produced patterning provides a planar, patterned surface, whereas an etched sample produces a non-planar patterned surface.

Example

We demonstrated this technique on amorphous vanadium dioxide films by using 50-fs optical pulses at 800-nm to locally anneal a pattern of crystalline $VO_2$ into an amorphous $VO_2$ film in a manner as described above with respect to FIG. 6 The laser annealing was conducted in an ambient environment, i.e., at room temperature and standard atmospheric pressure.

The resulting annealed patterning is shown in the optical microscope image in FIG. 7A, where the dark background is the amorphous $VO_2$ and the lighter line that outlines the perimeter of a square is a pattern comprising crystalline $VO_2$ written with a 5-mW, 50-fs, 800-nm laser while the sample was scanned. In this case, the laser diameter was 8-µm yet the annealed width is much smaller, owing to the nonlinear process which is selective to only the peak spatial amplitude of the optical pulse.

Raman spectroscopy was performed on the sample, and an image of the Raman spectra for the lower part of this patterned laser anneal is shown in FIG. 7B. This Raman image shows that the laser-exposed area exhibits the 195-$cm'$ Raman mode of crystalline $VO_2$ while the surrounding area does not.

The plot in FIG. 7C further demonstrates that the portions of the film exposed to the sub-picosecond laser pulses are crystallized $VO_2$ by comparing the Raman spectra of the amorphous area with that of the laser annealed regions. The laser annealed region shows a clear indication the Raman modes of crystalline $VO_2$ while the amorphous regions reflect the background Raman contributions from the substrate. Taking the difference between the Raman spectra of amorphous and laser patterned regions removes the influence of the substrate and clearly reveals five of the well-known $A_g$ Raman modes of $VO_2$ (195, 224, 312, 394, and 614 $cm^{-1}$). In addition, these spectra also show the absence of the Raman modes for $V_2O_5$, which often forms when amorphous $VO_2$ is annealed in ambient, thus, demonstrating that our ultrafast pulsed laser crystallizes the $VO_2$ without adding or removing oxygen from the sample.

Finally, using a continuous wave laser with over 10× the average power of the pulsed laser produced no discernable annealing or crystallization of the amorphous $VO_2$, further establishing the multiphoton nonlinear absorption process of the sub-picosecond pulsed laser.

By utilizing athermal and thermal processes, this sub-picosecond laser anneal can crystallize the sample on time-scales shorter than nanoseconds. Using this technique enables rapid patterning of the thin film by scanning the laser and/or sample.

The laser pulses will have a predetermined laser wavelength, pulse width, pulse energy, pulse repetition frequency, excitation spot size, laser beam profile, laser scanning rate, substrate, film thickness, and environment needed to obtain a predetermined rate and extent of annealing, depending on the optical and thermal properties on the materials and substrates used. To reduce and/or eliminate linear absorption the laser wavelength is chosen for the film and substrate used. Another aspect to choosing the laser wavelength, pulse energy, and pulse width, is that they can be selected in order to increase the multi-photon absorption cross-section of the film material compared to the substrate. The laser spot size will influence the rate at which the nonlinear process occurs and enable spatial control by producing maximum absorption at the minimum size (i.e., maximizing the optical intensity/fluence). The laser's pulse repetition rate and scanning rate will depend on the thermal properties of the film and substrate, the thickness of the film and substrate, and the environment.

Advantages and New Features.

The crystallization is due to ultrafast laser absorption in film via linear and nonlinear optical multiphoton process setting up nonequilibrium hot carriers, whose rapid energy relaxation produces an ultrafast annealing process. This is contrasted with current laser annealing techniques that use only linear absorption in substrate and/or UV lasers that are linearly absorbed in both the film and substrate, and whose fluence is insufficient to produce a nonequilibrium carrier distribution in the material.

This technique has the advantage of not requiring substrate absorption nor additional absorption layers, and using a low average power. This is due to the sub-picosecond excitation time-scale that enable nonequilibrium interactions. This allows annealing of films on substrates that cannot handle traditional growth and annealing temperatures without damage to the substrate. Hence, an example would be a low-temperature growth of amorphous $VO_2$ on a temperature sensitive polymer, and then ultrafast laser anneal, all occurring at temperatures of less than 150° C., thereby crystallizing the $VO_2$ film without damaging the polymer substrate.

Continuous wave (cw) lasers with the same or greater optical power do not perform annealing and crystallization of $VO_2$ from amorphous $VO_2$.

The sub-picosecond laser pulse provides rapid energy excitation through a combination of thermal and athermal crystal changes and produces annealing and crystallization on time-scales shorter than nanoseconds thereby enabling rapid patterning.

A single laser beam can be used, unlike other laser annealing techniques that require multiple laser beams.

Ultrafast athermal and thermal processes crystallize materials (such as $VO_2$) so rapidly that the diffusion lengths are greatly reduced as well as surface interactions. For example, this can prevent oxygen from entering or leaving the sample during the anneal time allowing for crystallization without environmental control or in atmospheric ambients. As another example, this could anneal regions without dopant diffusion, which for example is critical to create regions of different phase transition temperatures, thereby creating devices with multiple phase transition temperatures spatially separated from one another on the same film.

For polymorphic crystals, this laser annealing technique could be used to change one crystal type to another, e.g., rutile to anatase.

As an extension to modifying thin films, by focusing the laser within a bulk material complex 3D crystallized patterns can be created.

Focused laser annealing enables detailed patterning with sub-micron-scale feature size. The nonlinear processes resulting from sub-picosecond lasers produce a smaller heat-affected zone, and therefore does not interact (heating/annealing) with surrounding regions.

Although preheating the substrate is not required as in other laser annealing techniques, in some embodiments, preheating can be used to optimize annealing using the ultrafast annealing method in accordance with the present invention.

Alternatives

As described above, in many embodiments, the ultrafast laser annealing technique in accordance with the present invention will employ one or more sub-picosecond laser pulses applied to one or more predetermined locations on a thin film surface to crystallize and anneal the film. However, in other embodiments, the laser pulses can be directed at the surface of a bulk material to form annealed areas either on the surface or within the bulk material.

The ultrafast laser annealing technique can be accomplished using appropriate wavelengths and at appropriate pulse speed best suited for the ultrafast material annealing given the material system and surrounding environment. This could include using near-infrared lasers and/or UV ultrafast lasers.

As described above, in many embodiments, the ultrafast laser pulses used in the method for laser annealing in accordance with the present invention will have a sub-picosecond pulse duration. However in other embodiments, other ultrafast laser pulses having a pulse duration greater than a picosecond but less than about 10 ns can be used to produce nonlinear processes for the annealing of the present invention.

The ultrafast laser annealing technique in accordance with the present invention is not limited to annealing of amorphous $VO_2$ films but can be used with many other ALD-grown films that require crystalline structures to provide functionality such as oxide and nitride based films, III-Nitride films, films formed from ferroelectric oxides, or piezoelectric materials. In addition, the ultrafast laser annealing technique of the present invention is not limited to ALD-grown films and can be used with any thin-film fabrication technology.

In some embodiments, the ultrafast laser annealing technique in accordance with the present invention can be used to achieve heterogeneous integration of dissimilar materials that prevent crystallization or prevent the formation of desired properties in the film. For example, it can be used with metal contacts that are generally annealed but then diffuse to active areas, oxides on nitrides, nanolaminates (e.g., Josephson junctions, gate dielectrics, high electron mobility transistors, or neuromorphic films), etc.

The ultrafast laser annealing technique of the present invention can also be applied to different layers in a layer-by-layer fashion, thereby enabling its use in additive, or "3-D," manufacturing. This lends itself especially well to industrial processing of ALD-deposited films. In such layer-by-layer fabrication, the ultrafast laser annealing technique can be used as each layer is being created, after each layer is created, or after all layers have been created by adjusting laser parameters, such as laser focus and wavelength for transparency through the layers.

Other films that can benefit from the ultrafast laser annealing technique of the present invention include films requiring dopant activation, especially in films such as wide-bandgap semiconductors that require high temperatures that can degrade the films. The ultrafast laser annealing technique of the present invention could also be used to control dopants within a material without thermal diffusion. For example, in $VO_2$ the deposition of dopants in the amorphous phase combined with ultrafast laser annealing could produce regions with different phase-transition temperatures, and these regions could be spatially separated from one another. In one example, on a single microelectronic chip different circuits could be integrated each with different phase-transition thresholds.

This method of local annealing without influencing the surrounding areas enables ultrafast laser annealing and patterning within already fabricated systems. For example, tuning the wavelength to produce nonlinear optical absorption in the target region, yet remaining non-absorbing (or transparent) in other regions.

Since crystallization can influence etch rates, local ultrafast laser annealing can provide opportunities for enhancing localized etching and patterning due to the etch rate variation for different crystallized regions.

Using this ultrafast laser annealing technique for creating arrays of small features in a larger background enables creation of electromagnetic metamaterials and metasurfaces.

Thus, the ultrafast laser annealing technique described herein can be used with many different materials to achieve many different ends. Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

We claim:

1. A method for selectively producing at least one predetermined crystalline area in an amorphous thin film disposed on a substrate, comprising the steps of:
   directing one or more laser pulses having a sub-picosecond pulse width at a predetermined location or plurality of locations on a surface of an amorphous thin film, each of the laser pulses having a predetermined laser wavelength, pulse width, pulse energy, pulse repetition frequency, excitation spot size, beam profile, and scanning rate;
   wherein the wavelength, pulse width, pulse energy, pulse repetition frequency, excitation spot size, beam profile, and scanning rate of the laser pulses produces a predetermined absorption of energy from the laser pulse into the amorphous thin film without absorption of the energy into the substrate; and
   wherein the absorbed energy from the laser pulses locally crystallizes the amorphous thin film material via a nonlinear athermal process in less than one nanosecond so as to selectively transform at least one amorphous area of the thin film into a predetermined crystalline area in the thin film.

2. The method according to claim 1, wherein the thin film is vanadium dioxide ($VO_2$).

3. The method according to claim 1, wherein the laser pulses produce a predetermined pattern of annealed areas on the surface of the amorphous thin film.

4. The method according to claim 1, wherein the laser pulses produce a predetermined pattern of crystalline material that forms an electromagnetic metasurface material on the substrate.

5. The method according to claim 1, wherein the laser pulses produce a predetermined volume of crystalline material within a volume of the amorphous thin film.

6. The method according to claim 5, wherein the laser pulses produce a predetermined volume of crystalline metamaterial within a volume of the amorphous thin film.

7. The method according to claim 1, wherein the laser pulses have a wavelength of 800 nm.

8. The method according to claim 1, wherein the laser pulses have a pulse duration of 50 fs.

9. The method according to claim 1, wherein the laser pulses have a power of 5 mW.

* * * * *